United States Patent
Larsson et al.

(10) Patent No.: US 6,687,722 B1
(45) Date of Patent: Feb. 3, 2004

(54) HIGH-SPEED/LOW POWER FINITE IMPULSE RESPONSE FILTER

(75) Inventors: Patrik Larsson, Matawan, NJ (US); Christopher John Nicol, West Pymble (AU)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 09/526,836

(22) Filed: Mar. 16, 2000

(51) Int. Cl.[7] .............................................. G06F 17/10
(52) U.S. Cl. ...................................................... 708/319
(58) Field of Search .......................................... 708/319

(56) References Cited

U.S. PATENT DOCUMENTS

| | | | | |
|---|---|---|---|---|
| 5,751,619 A | * | 5/1998 | Agarwal et al. ............ 708/523 |
| 5,761,106 A | * | 6/1998 | Crocker ...................... 708/630 |
| 5,777,679 A | * | 7/1998 | Cheney et al. .............. 708/203 |
| 5,974,435 A | * | 10/1999 | Abbott ........................ 708/523 |
| 6,360,189 B1 | * | 3/2002 | Hinds et al. ................ 708/523 |
| 6,438,569 B1 | * | 8/2002 | Abbott ........................ 708/603 |

* cited by examiner

Primary Examiner—Tan V. Mai

(57) ABSTRACT

A partial carry-save format is employed for a finite impulse response filter output representation, thereby reducing a number of flip-flops and hence power. By replacing the least significant bit processing section on the output side of the finite impulse response filter with a combined carry-save adder and carry-propagate adder followed by a register rather than two flip-flops, the load on the clock can be reduced, thereby achieving reduced propagation delay. To further improve the performance of the finite impulse response filter, a simpler carry-save adder is employed in the least significant bit section, which is possible due to the use of a single register at an input to each of the carry-save adders rather than two flip-flops, one for a carry output and one for a sum output from the adder. The combination of a reduction of half of the flip-flops and a replacement of a simpler carry-save adder for each of the carry-save adders results in a significant improvement in the overall filter performance and power and space consumption.

21 Claims, 6 Drawing Sheets

HIGH-SPEED/LOW POWER FINITE IMPULSE RESPONSE FILTER

BACKGROUND OF THE INVENTION

The present invention relates generally to methods and apparatuses for performing finite impulse response (FIR) filter operations, and more particularly to a method and apparatus for performing a finite impulse response filter operation that consumes low power without degrading the FIR filter's performance.

Modem applications require low cost chips containing integrated FIR filters. The widely known and understood FIR filter essentially performs a sum-of-products computation. In Very Large Scale Integration architectures, a fast FIR filter normally contains a set of multipliers to weight the input samples by the filter coefficients and a set of adders to accumulate the multiplier results. Given that hardware multipliers are essentially the addition of multiple partial products, the multiplier is often combined with the adders to make the FIR filter structure.

A well-known technique for accumulating several numbers is to use a carry-save format. A carry-save adder (CSA) does not propagate the carry in the normal manner but rather stores the carry in a separate vector. Carry-save adders are faster and more efficient than carry-propagate adders (CPA). Carry-save adders are normally configured with each adder taking four operand vectors and producing two result vectors (a sum and a carry vector).

In FIG. 1, carry-save adders 1 are used to add together the outputs, of several multipliers 2, each of which outputs a result in carry-save format. Each carry-save adder 1 adds two numbers in carry-save format—one from the multiplier 2 and the other from the previous carry-save adder. 1, the output of which is stored in flip-flops 4. In FIG. 1, the carry-save adders 1 are indicated as "4-2" meaning four inputs and two outputs At the output of the filter there are only two vectors to be added together, at which point a single carry-propagate adder 3 is used to compute the final result. In FIG. 1, the vectors are partitioned into most significant bit (MSB) and least significant bit (LSB) components for later comparison.

In high-speed filters, the transposed FIR form is commonly used to achieve the highest performance because the series adders are populated with flip-flops 4 to enable each multiply-add operation to take a complete clock cycle to execute. This filter structure contains flip-flops 4 in the output accumulation path. Because the results are stored in carry-save format, there are actually two flip-flops 4 per bit of precision in the output path (one for the sum bit and one for the carry bit). The flip-flops 4 are shown as registers in FIG. 1 and marked Clsb/Cmsb and Slsb/Smsb for carry least significant bit/most significant bit and sum least significant bit/sum most significant bit, respectively.

The advantages with carry-save arithmetic include reduced propagation delay, reduced integration area and reduced power dissipation because one adder is eliminated at each multiplier output. A disadvantage is that more flip-flops are needed when pipelining the carry-save filter accumulation paths. These additional flip-flops lead to increased power consumption mainly due to increased current drain on the source of the clock signal.

The present invention is therefore directed to the problem of developing a method and apparatus for performing an FIR filter operation without consuming much power and without any degradation in filter performance while maintaining reduced propagation delay.

SUMMARY OF THE INVENTION

The present invention solves this problem by using a partial carry-save format for the filter output representation thereby reducing the number of flip-flops or registers and hence the power. By replacing the least significant bit processing section on the output side of the finite impulse response (FIR) filter with a combined carry-save adder and carry-propagate adder followed by a single register rather than two registers or flip-flops, the present invention reduces the load on the clock and achieves a reduced propagation delay.

To further improve the performance of the FIR filter, the present invention employs a simpler carry-save adder than heretofore was possible by using a single register at the input to each of the carry-save adders in the least significant bit portion rather than two registers or flip-flops, one for the carry and one for the sum. The combination of a reduction of half of the registers or flip-flops and a concomitant replacement of a simpler carry-save adder for each of the carry-save adders results in a significant improvement in the overall filter performance.

DETAILED DESCRIPTION

One aspect of the present invention involves improving the speed of a multiplier. As the inventors have recognized, the propagation delays through a multiplier circuit are not equal. Therefore, the individual bits of the result will arrive at different times even though the inputs might arrive simultaneously. The reason for this is demonstrated in FIG. 2.

Figure 2:
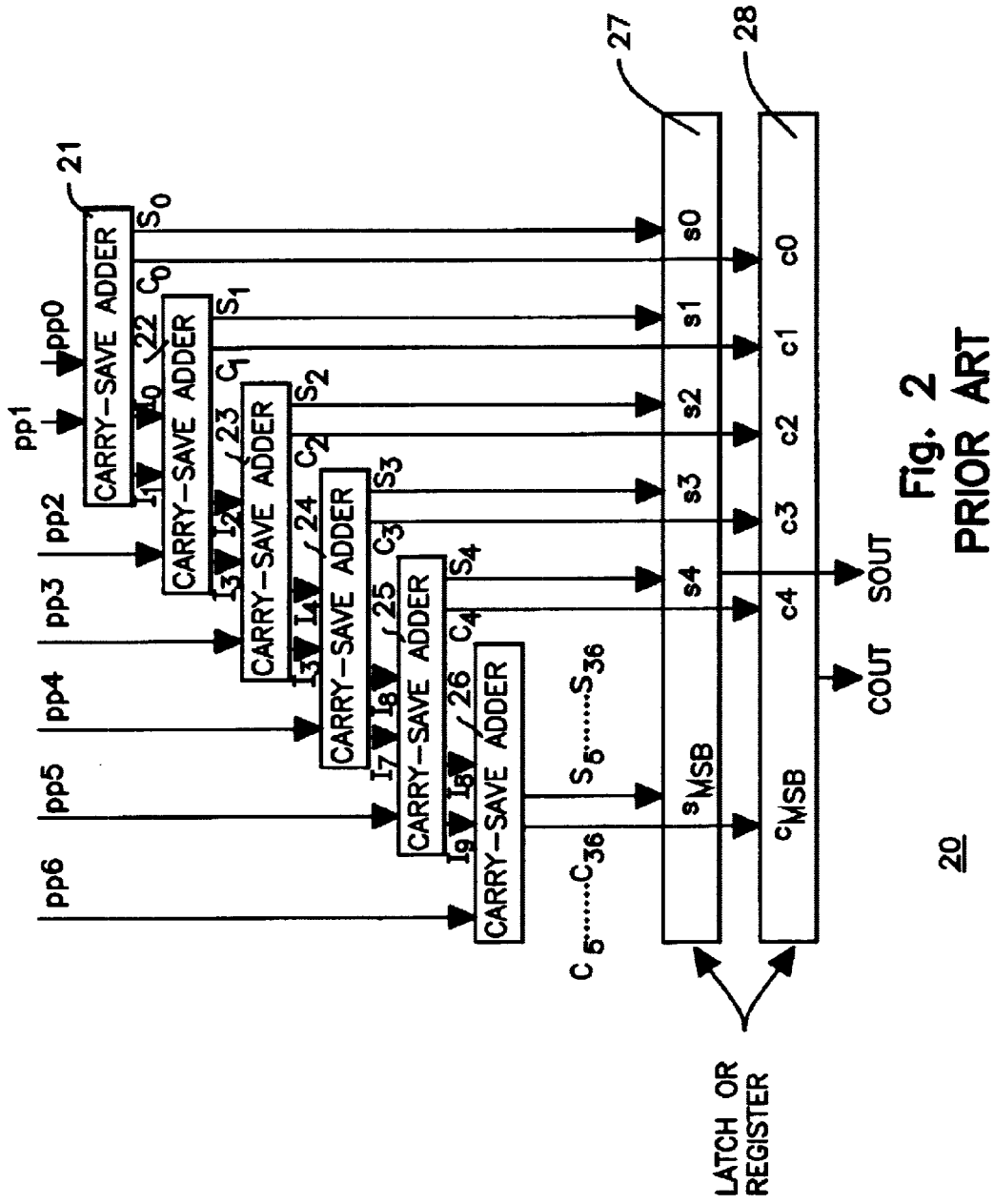
FIG. 2 depicts a carry-save multiplier showing propagation delays according to a conventional configuration.

FIG. 2 depicts a conventional carry-save multiplier 20. Carry-save adders 21–26 add pairs of partial products (PP0–PP6) and the intermediate values (I0–I9) from earlier carry-save adders 22–26. PP0–PP6 are vectors whose length depends on the size of the overall carry-save multiplier. For example, if CSA 20 is a 32-bit output multiplier, PP0 through PP6 are each 32-bit wide vectors (bits 0–31). Moreover, vectors I0 through I9 are 31-bit wide vectors (bits 0–30), as the remaining bits are output directly to the registers 27, 28. The output of carry-save adder 26 is two 32-bit vectors CMSB and SMSB.

The outputs of the carry-save adders 21–26 are accumulated in registers 27, 28. If the output is a 32-bit value, then each register 27, 28 will contain 37 bits. The partial products (PPs) in a multiplier are all shifted before they are added, because a multiplication is essentially a shift-add operation. The least-significant bits (LSBs) of the result are computed from the addition of fewer partial products than the middle bits (e.g., S0 is derived from PP0, whereas S4 is derived from PP0, PP1, PP2, PP3 and PP4). Therefore, the evaluation of S0 is completed earlier than S4 because it has a simpler Boolean function.

The early arrival of the least significant bits in a multiplier can be exploited to reduce the number of flip-flops by incorporating the least significant bits of a carry-propagate adder into the least significant bit portions of the multiplier itself. The least significant bits of the carry-propagate adder are simply a ripple-carry adder and the most significant bits are computed using a faster, more parallel structure (such as carry-select, carry-skip or look-ahead adder, for example). By placing the least significant bits of a carry-propagate adder into the multiplier, only a single flip-flop is needed for each of the least significant bits. This concept is demonstrated in FIG. 3, which depicts a multiplier 30 according to one aspect of the present invention.

Figure 3:
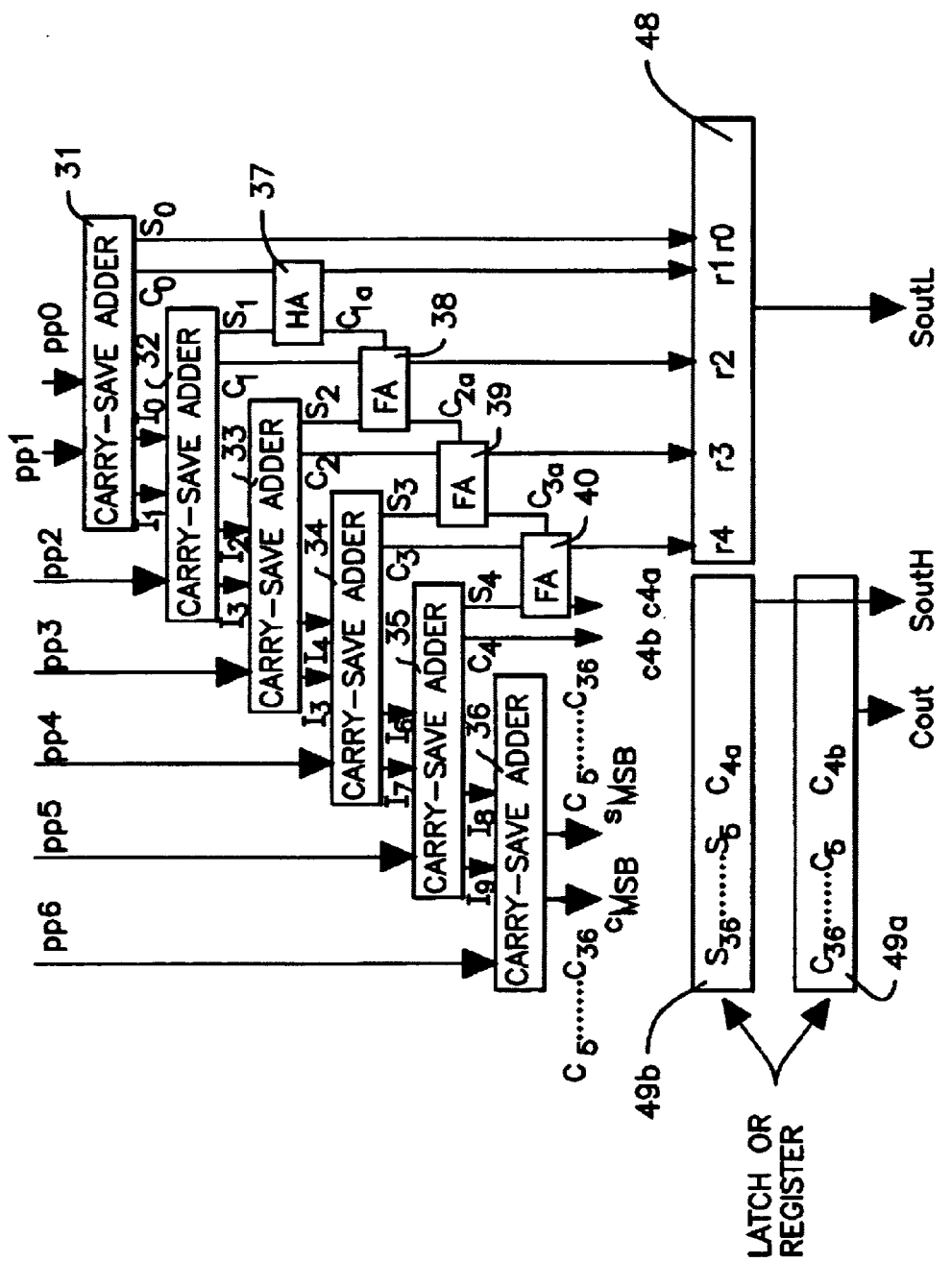
FIG. 3 depicts an exemplary embodiment of pipeline retiming of a multiplier according to one aspect of the present invention.

Referring to FIG. 3, the sum and carry vectors are partitioned into most significant bit and least significant bit components. The least significant bit components are fed into ripple-carry adders 37–40. The carry-output of the adders 37–40 becomes the bit 0 (c4a) of the most-significant carry vector. The SUM outputs of the ripple carry adder become the SoutL bits of the result, which are accumulated in a register 43. As in the above implementation, the remaining bits are accumulated in registers 49a, 49b.

In sum, the carry and save registers 49a, 49b which relate to the least significant bits have been replaced with a single register 48 and a carry-propagate adder comprised of full adders 38–40 and half adder 37. The result is a faster, lower power multiplier 30.

Figure 1:
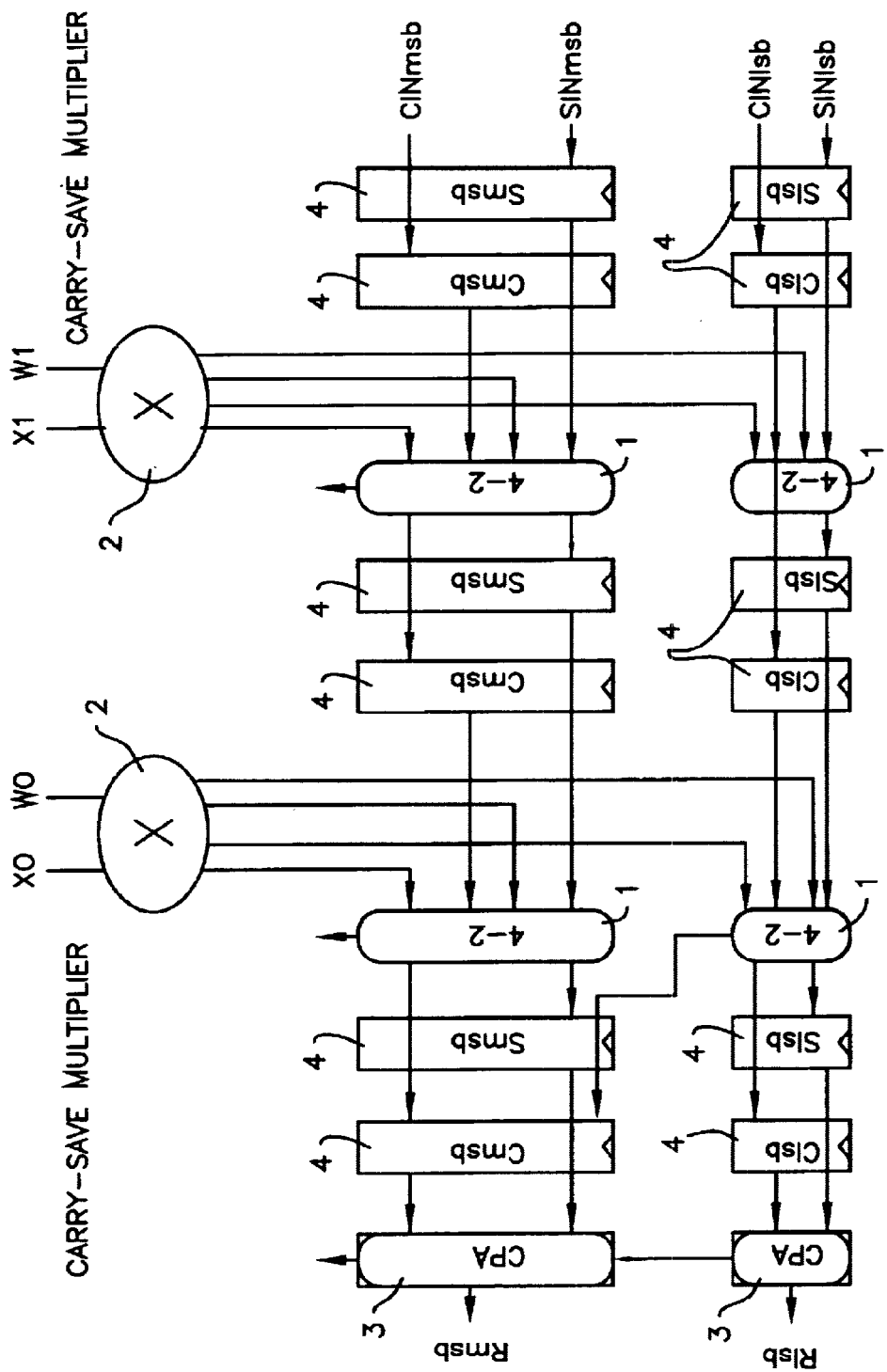
FIG. 1 depicts a carry-save format to accumulate the multiplier outputs in a finite impulse response (FIR) filter according to a conventional configuration.

According to another aspect of the present invention, the application of the above pipeline retiming in a multiplier is applied to a finite impulse response filter, as shown in FIG. 1. The end result is shown in exemplary embodiment of FIG. 4.

Figure 4:
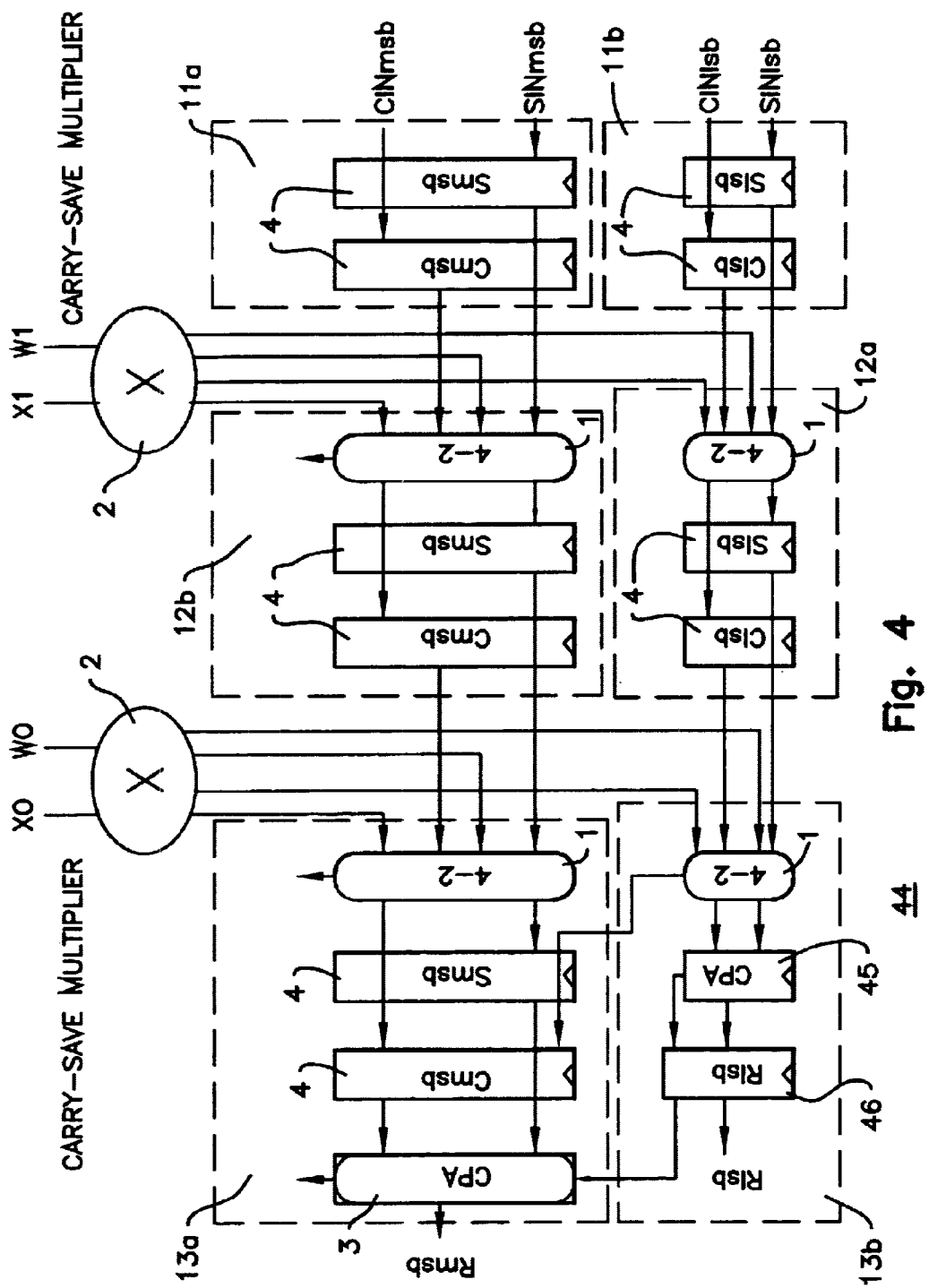
FIG. 4 depicts an exemplary embodiment of a pipeline retiming of a finite impulse response filter according to one aspect of the present invention.

Turning to FIG. 4, FIR filter 44 includes an input stage 11 having a most signification (MSB) section 11a and a least significant bit (LSB) section 11b. Following the input stage 11 is a carry-save adder stage 12, which has an LSB section 12a and an MSB section 12b. On the output side, the FIR filter 44 includes a carry-save adder/carry-propagate adder stage 13, which has an LSB section 13a and an MSB section 13b. The LSB section 13b of the carry-save adder/carry-propagate adder stage 13 is modified to include a carry-save adder 1 followed by a carry-propagate adder 45, which is in turn followed by a single register 46 rather than two registers or flip-flops.

The application of pipeline retiming to the finite impulse response filter in FIG. 1 produces the structure 44 in FIG. 4. The least significant bits of the carry propagate adder on the output of the filter have been relocated into the least significant bits of the carry-save adder in the accumulation path. To aid in comparing the structure in FIG. 1 to the structure in FIG. 4, the same reference numerals used in FIG. 1 are used in FIG. 4 to refer to the same elements. The end result of embodiment 44 is that the output of the carry-save adder 1 is fed directly into the carry propagate adder 45, whose output in turn is accumulated in a single register 46. Thus, at a minimum, a single register is saved on each stage of the least significant bit section.

Figure 5:
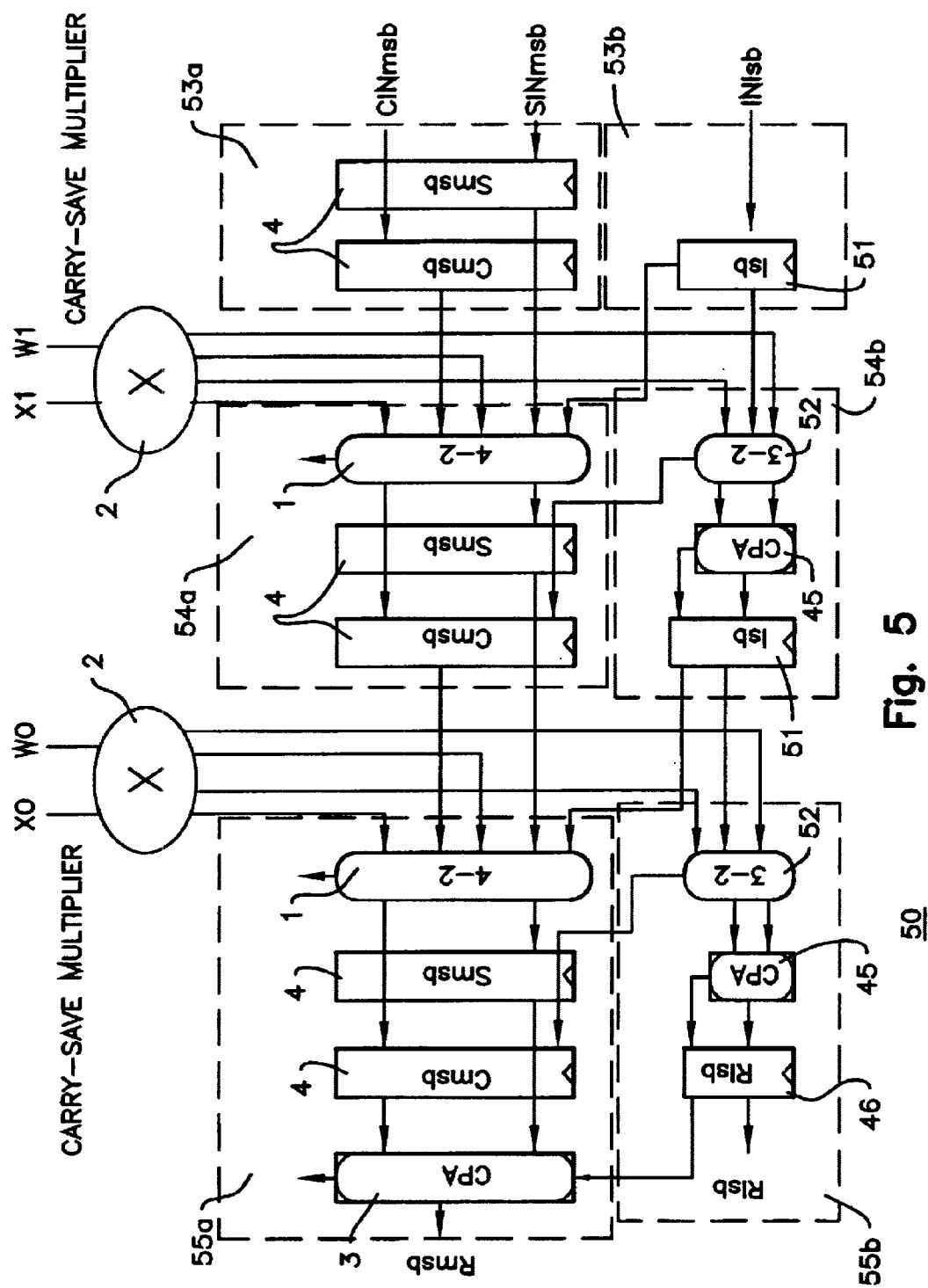
FIG. 5 depicts an exemplary embodiment of a finite impulse response filter structure according to one aspect of the present invention.

An exemplary embodiment 50 of one aspect of the present invention is drawn in FIG. 5. To aid in comparing the structure in FIG. 1 and FIG. 4 to the structure in FIG. 5, the same reference numerals used in FIG. 1 and FIG. 4 are used in FIG. 5 to refer to the same elements. The FIR filter 50 includes an input stage 53, which has an MSB section 53a and an LSB section 53b. Following the input stage 53 is a carry-save adder/carry-propagate adder stage 54, which has an MSB section 54a and an LSB section 54b. On the output side of the filter 50, there is another carry-save adder/carry-propagate adder stage 55, which has an MSB section 55a and an LSB section 55b.

The least significant bits of every accumulate stage in the filter 50 are replaced by a 3-2 carry-save adder 52 (rather than a 4-2 carry save adder 1 used in FIG. 1 and FIG. 4) and the outputs of the 3-2 carry-save adder 52 are added together in a carry-propagate adder 45 (similar to that in FIG. 4). This embodiment 50 has the advantage of fewer 4-2 carry save adders (the complexity of a 4-2 carry save adder is approximately twice the complexity of a 3-2 carry save adder), and fewer flip-flops (three registers or flip-flops 4 in the LSB section of the FIR of FIG. 5 versus six registers or flip-flops 4 in the LSB section of the FIR of FIG. 1). Moreover, this reduction in power consumption is achieved without any degradation in speed.

Figure 6:
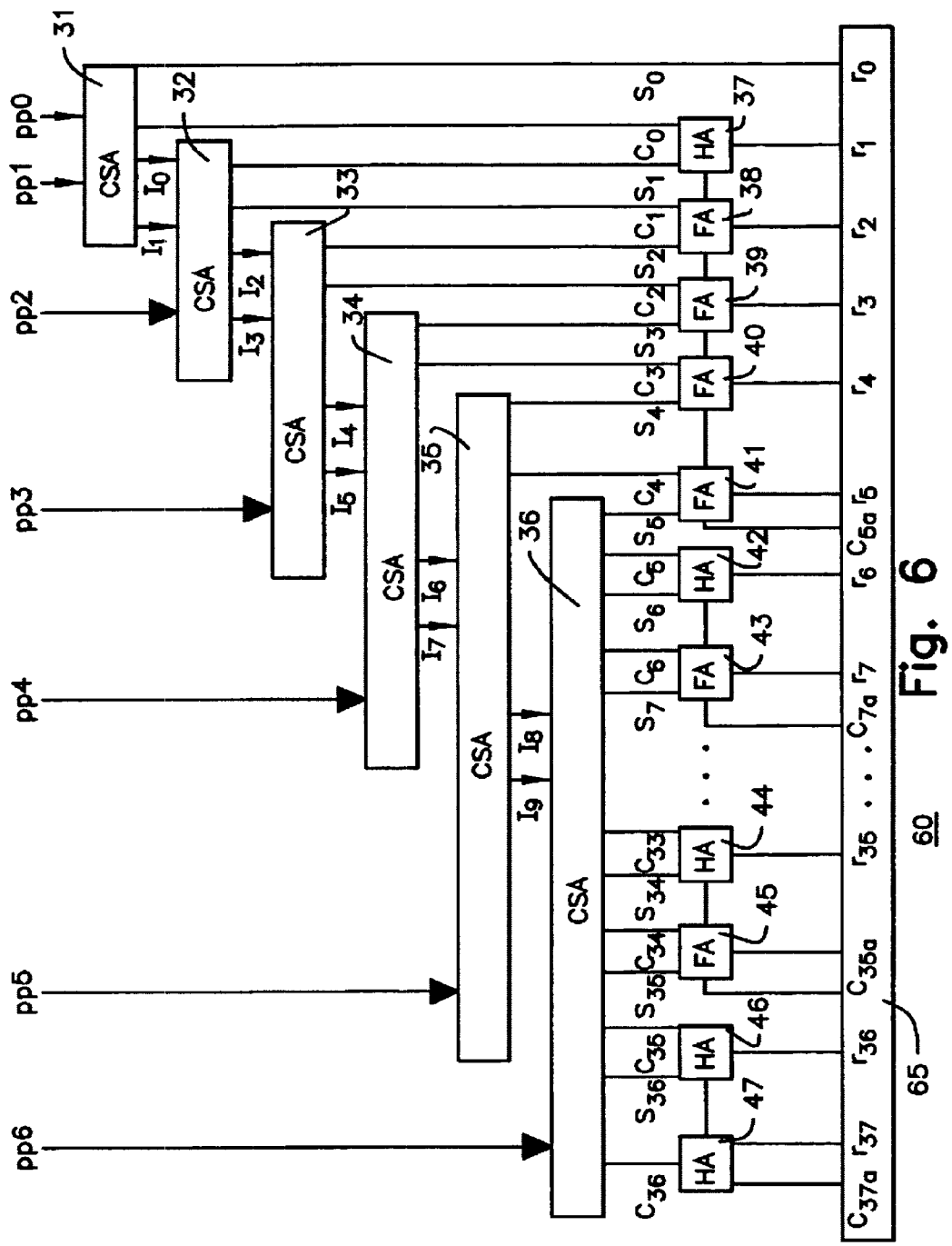
FIG. 6 depicts an exemplary embodiment of another aspect of the present invention, in which a number of flip-flops in the most significant bit path is reduced.

If some speed degradation is acceptable, some of the Cmsb and Smsb bits can also be reduced. One such implementation 60 is shown in FIG. 6, which saves 25% of the registers, as each group of four bits is reduced to three. For example, bits s7, c6, s6 and c5 are converted to bits c7a, r7 and r6, respectively, by adders 43 and 42. Adder pairs 44, 45 and 46, 47 perform similar functions for their inputs. The adder pairs repeat depending upon the length of the multiplier 60. The last two three bits output by carry-save adder 36 are the sum bit s36, carry bit c36 and carry bit c35, which are converted into c37a, r37 and r36 by adders 46, 47 as shown in FIG. 6.

As shown in FIG. 6, the registers 49a, 49b of FIG. 3, are replaced with adders 41 47, and a single output register 65. Output register 65 can be either a single register, combining registers 49a, 49b and 48 or two registers, one for the least significant bits, such as register 48, and another for the most significant bits. The output of the adders 41–47 are fed into the single MSB output register 65, thereby reducing the number of registers by at least one for each stage. The inputs to the adders 41–47 are from the carry-save adders 35 and 36 as shown in FIG. 6. The inputs to adders 37–40 remain as shown in FIG. 3. Thus, bit r5 comes directly from adder 41 and carry bit c5a also comes from adder 41. The output from half-adder 42 is r6. The output from full-adder 43 is bit r7 and carry bit c7a. At the end of the register, the output from half-adder 47 is r37 and a carry bit c37a; and the output from half-adder 46 is r36. The output from full-adder 45 is carry bit c35a, and result bit r35. Result bit r34 comes from half-adder 44. The half-adder/full adder combination repeats as shown in FIG. 6, depending upon the length of the multiplier 60. In a 32-bit multiplier, the end result is each 4-bit group output by carry-save adder 36 is converted into a 3-bit group and stored in a register, thereby reducing the number of bits in the register from a total of 64 bits (i.e., two registers 27, 28 times 32-bits stored in each register) to 48 bits (i.e., one register storing 16 groups of 3-bits). Thus saving 25% of the memory requirements, for a small speed degradation.

For a tree multiplier, it can be shown that some of the most significant bits can be reduced with the structure in FIG. 6 without speed penalty. For filters with many taps, it is customary to have an adder with more bits than the multiplier output to avoid overflow and underflow checking. In this case, the most significant bits that extend beyond the multiplier output can be reduced significantly without delay penalty.

According to another aspect of the present invention, a method for performing a finite impulse response filter operation reduces the number of registers or flip-flops required by receiving a least significant bit input with a single input register. On the most significant bit section, two registers or flip-flops are used, one for a most significant bit carry input and one for a most significant bit sum input. In the adder sections, a carry-save adder coupled to a carry-propagate adder coupled to a single register is employed in each adding stage in a least significant bit portion of the finite impulse response filter. In the most significant bit portion of the finite impulse response filter in each adding stage, a carry-save adder coupled to two flip-flops, one for a carry output and one for a sum output, is employed.

The above architecture permits the use of a carry-save adder with fewer inputs in the least significant bit portion of the finite impulse response filter than the carry-save adder in the most significant bit portion of the finite impulse response filter. For example, the carry-save adder in the least significant bit portion of the finite impulse response filter may consist of a 3-2 carry-save adder, whereas the carry-save adder in the most significant bit portion of the finite impulse response filter may consist of a 4-2 carry-save adder.

What is claimed is:

1. An apparatus comprising:
   a finite impulse response filter comprising:
   an input stage including a most significant bit portion receiving a most significant bit sum input and a most significant bit carry input, and a least significant bit portion receiving a least significant bit sum input and a least significant bit carry input;
   a first multiplier multiplying a first coefficient and a first weight and outputting a result of the multiplication as a most significant bit pair and a least significant bit pair;
   a carry-save adder stage including:
      a most significant bit portion-coupled to the first multiplier and receiving the most significant bit pair from the first multiplier, coupled to the most significant bit portion of the input stage and receiving the most significant bit sum and most significant bit carry inputs, and outputting a most significant bit sum and a most significant bit carry; and
      a least significant bit portion coupled to the first multiplier and receiving the least significant bit pair from the first multiplier, coupled to the least significant bit portion of the input stage and receiving the least significant bit sum and carry inputs, and outputting a least significant bit sum and a least significant bit carry;
   a second multiplier multiplying a second coefficient and a second weight and outputting a result of the multiplication as a most significant bit pair and a least significant bit pair; and
   a carry-save adder/carry-propagate adder stage outputting a most significant bit result and a least significant bit result and including:
      a most significant bit portion coupled to the second multiplier and receiving the most significant bit pair from the second multiplier, coupled to the most significant bit portion of the carry-save adder stage and receiving the most significant bit sum and carry output from the carry-save adder stage, and outputting the most significant bit result; and
      a least significant bit portion coupled to the second multiplier and receiving the least significant bit pair from the second multiplier, coupled to the least significant bit portion of the carry-save adder stage and receiving the least significant bit sum and carry outputs from the carry-save adder stage, and
      outputting the least significant bit result.

2. The apparatus according to claim 1, wherein the least significant bit portion of the carry-save adder/carry-propagate adder stage comprises:
   a least significant bit carry-save adder adding the least significant bit pair from the second multiplier and the least significant bit sum and least significant bit carry outputs from the carry-save adder stage and outputting a least significant bit sum output and a least significant bit carry output;
   a least significant bit carry-propagate adder coupled to the least significant bit carry-save adder, adding the least significant bit sum and carry outputs from the least significant bit carry-save adder and outputting the least significant bit result; and
   a least significant bit result register coupled to the least significant bit carry-propagate adder and storing the least significant bit result from the least significant bit carry-propagate adder.

3. The apparatus according to claim 2, wherein the most significant bit portion of the carry-save adder/carry-propagate adder stage further comprises:
   a most significant bit carry-save adder adding a most significant bit pair from the second multiplier and the most significant bit sum and most significant bit carry outputs from the carry-save adder stage, and outputting a most significant bit sum and a most significant bit carry;
   a most significant bit sum register coupled to the most significant bit carry-save adder and receiving the most significant bit sum output from the most significant bit carry-save adder;
   a most significant bit carry register coupled to the most significant bit carry-save adder and receiving the most significant bit carry output from the most significant bit carry-save adder; and
   a most significant bit carry-propagate adder coupled to the most significant bit sum register and the most significant bit carry register and outputting the most significant bit result.

4. The apparatus according to claim 3, wherein the LSB carry-save adder comprises a 4-2 carry-save adder, and the most significant bit carry-save adder comprises a 4-2 carry-save adder.

5. The apparatus according to claim 1, wherein the least significant bit portion of the carry-save adder stage includes:
   a least significant bit carry-save adder adding the LSB pair from the first multiplier and the LSB sum and LSB carry inputs from the input stage and outputting an LSB sum and an LSB carry;
   an LSB sum register coupled to the LSB carry-save adder and receiving the LSB sum output from the LSB carry-save adder; and
   an LSB carry register coupled to the LSB carry-save adder and receiving the LSB carry output from the LSB carry-save adder.

6. The apparatus according to claim 5, wherein the most significant bit portion of the carry-save adder stage includes:

a most significant bit carry-save adder adding the most significant bit pair from the first multiplier and the most significant bit sum and most significant bit carry inputs from the input stage and outputting a most significant bit sum output and a most significant bit carry output;

a most significant bit sum register coupled to the most significant bit carry-save adder and receiving the most significant bit sum output from the most significant bit carry-save adder; and a most significant bit carry register coupled to the most significant bit carry-save adder and receiving the most significant bit carry output from the most significant bit carry-save adder.

7. The apparatus according to claim 6, wherein the LSB carry-save adder comprises a 4-2 carry-save adder, and the most significant bit carry-save adder comprises a 4-2 carry-save adder.

8. The apparatus according to claim 1, wherein the most significant bit portion of the input stage includes:

a most significant bit sum register receiving the most significant bit sum input; and a most significant bit carry register receiving the most significant bit carry input.

9. The apparatus according to claim 1, wherein the LSB portion of the input stage includes:

an LSB sum register receiving the LSB sum input; and an LSB carry register receiving the LSB carry input.

10. An apparatus comprising:

a finite impulse response filter, comprising:

an input stage including a most significant bit portion receiving a most significant bit sum input and a most significant bit carry input, and an least significant bit portion receiving a least significant bit input;

a first multiplier multiplying a first coefficient and a first weight and outputting a result of the multiplication as a most significant bit pair and a least significant bit pair;

a first carry-save adder/carry propagate adder stage including:

a most significant bit portion coupled to the first multiplier and receiving the most significant bit pair from the first multiplier, coupled to the most significant bit portion of the input stage and receiving the most significant bit sum, most significant bit carry and least significant bit inputs from the input stage, and outputting a most significant bit sum and a most significant bit carry; and a least significant bit portion coupled to the first multiplier and receiving the least significant bit pair from the first multiplier, coupled to the least significant bit portion of the input stage and receiving the least significant bit input from the input stage, and outputting a least significant bit sum and a least significant bit carry;

a second multiplier multiplying a second coefficient and a second weight and outputting a result of the multiplication as a most significant bit pair and a least significant bit pair; and a second carry-save adder/carry-propagate adder stage outputting a most significant bit result and a least significant bit result and including:

a most significant bit portion coupled to the second multiplier and receiving the most significant bit pair from the second multiplier, coupled to the most significant bit portion of the first carry-save adder/carry-propagate adder stage and receiving the most significant bit sum and most significant bit carry output from the first carry-save adder/carry-propagate adder stage, coupled to the least significant bit portion of the first carry-save adder/carry-propagate adder stage and receiving the least significant bit carry output from the first carry-save adder/carry-propagate adder stage, and outputting the most significant bit result; and a least significant bit portion coupled to the second multiplier and receiving the least significant bit pair from the Second multiplier, coupled to the least significant bit portion of the first carry-save adder/carry propagate adder stage and receiving the least significant bit sum output from the first carry-save adder/carry propagate adder stage, and outputting the least significant bit result.

11. The apparatus according to claim 10, wherein the LSB portion of the second carry-save adder/carry-propagate adder stage comprises:

an LSB carry-save adder adding the LSB pair from the second multiplier and the LSB sum output from the first carry-save adder/carry-propagate adder stage and outputting an LSB sum output and an LSB carry output;

an LSB carry-propagate adder coupled to the LSB carry-save adder, adding the LSB Sum and carry outputs from the LSB carry-save adder and outputting the LSB result; and an LSB result register coupled to the LSB carry-propagate adder and storing the LSB result from the LSB carry-propagate adder.

12. The apparatus according to claim 11, wherein the most significant bit portion of the second carry-save adder/carry-propagate adder stage further comprises:

a most significant bit carry-save adder adding the most significant bit pair from the second multiplier and the most significant bit sum, most significant bit carry and least significant bit carry outputs from the first carry-save adder/carry-propagate adder stage, and outputting a most significant bit sum and a most significant bit carry;

a most significant bit sum register coupled to the most significant bit carry-save adder and receiving the most significant bit sum output from the most significant bit carry-save adder;

a most significant bit carry register coupled to the most significant bit carry-save adder and receiving the most significant bit carry output from the most significant bit carry-save adder; and a most significant bit carry-propagate adder coupled to the most significant bit sum register and the most significant bit carry register and outputting the most significant bit result.

13. The apparatus according to claim 12, wherein the LSB carry-save adder comprises a 3-2 carry-save adder, and the MOST SIGNIFICANT BIT carry-save adder comprises a 4-2 carry-save adder.

14. The apparatus according to claim 10, wherein the LSB portion of the first carry-save adder/carry-propagate adder stage includes:

an LSB carry-save adder adding the LSB pair from the first multiplier and the LSB input from the input stage and outputting an LSB sum and an LSB carry;

an LSB carry-propagate adder coupled to the LSB carry-save adder, adding the LSB sum and carry outputs from the LSB carry-save adder and outputting the LSB result; and an LSB result register coupled to the LSB carry-propagate adder and storing the LSB result from the LSB carry-propagate adder.

15. The apparatus according to claim 14, wherein the MOST SIGNIFICANT BIT portion of the carry-save adder/carry-propagate adder stage includes:

a MOST SIGNIFICANT BIT carry-save adder adding the MOST SIGNIFICANT BIT pair from the first multiplier and the MOST SIGNIFICANT BIT sum, MOST SIGNIFICANT BIT carry and LSB inputs from the input stage and outputting a MOST SIGNIFICANT BIT sum output and a MOST SIGNIFICANT BIT carry output;

a MOST SIGNIFICANT BIT sun register coupled to the MOST SIGNIFICANT BIT carry-save adder and receiving the MOST SIGNIFICANT BIT sum output from the MOST SIGNIFICANT BIT carry-save adder; and a MOST SIGNIFICANT BIT carry register coupled to the MOST SIGNIFICANT BIT carry-save adder and receiving the MOST SIGNIFICANT BIT carry output from the MOST SIGNIFICANT BIT carry-save adder.

16. The apparatus according to claim 15, wherein the LSB carry-save adder comprises a 3-2 carry-save adder, and the MOST SIGNIFICANT BIT carry-save adder comprises a 4-2 carry-save adder.

17. The apparatus according to claim 10, wherein the MOST SIGNIFICANT BIT portion of the input stage includes:

a MOST SIGNIFICANT BIT sum register receiving the MOST SIGNIFICANT BIT sum input; and a MOST SIGNIFICANT BIT carry register receiving the MOST significant BIT carry input.

18. The apparatus according to claim 10, wherein the LSB portion of the input stage includes:

an LSB register receiving the LSB input.

19. A method for performing a finite impulse response filter operation comprising the steps of:

receiving a least significant bit input with a single input register;

receiving a most significant bit input with two registers, one for a most significant bit carry input and one for a most significant bit sum input;

using a carry-save adder coupled to a carry-propagate adder coupled to a single register in each adding stage in a least significant bit portion;

using a carry-save adder coupled to the registers, one for a carry output and one for a sum output, in each adding stage of a most significant bit portion; and passing the result to an output stage.

20. The method according to claim 19, further comprising the step of in the output stage, using a carry-save adder with fewer inputs in the least significant bit portion than the carry-save adder in the most significant bit portion.

21. The method according to claim 20, wherein the carry-save adder in the least significant bit portion comprises a 3-2 carry-save adder and the carry-save adder in the most significant bit portion comprises a 4-2 carry-save adder.

* * * * *